United States Patent
Chang et al.

(10) Patent No.: US 7,270,446 B2
(45) Date of Patent: Sep. 18, 2007

(54) LIGHT MODULE WITH COMBINED HEAT TRANSFERRING PLATE AND HEAT TRANSFERRING PIPES

(75) Inventors: Chih-Chin Chang, Hsin-Chu (TW); Teng-Huei Huang, Hsin-Chu Hsien (TW); Chien-Lung Lee, Nan-Tou Hsien (TW)

(73) Assignee: Lighthouse Technology Co., Ltd, Hu-Kuo, Hsin-Chu Hsien (TW)

( * ) Notice: Subject to any disclaimer, the term of this patent is extended or adjusted under 35 U.S.C. 154(b) by 76 days.

(21) Appl. No.: 10/908,339

(22) Filed: May 9, 2005

(65) Prior Publication Data

US 2006/0250800 A1 Nov. 9, 2006

(51) Int. Cl.
 *F21V 29/00* (2006.01)
(52) U.S. Cl. ............... 362/294; 362/373; 362/800
(58) Field of Classification Search ........... 362/294, 362/373, 547
 See application file for complete search history.

(56) References Cited

U.S. PATENT DOCUMENTS

| | | | | |
|---|---|---|---|---|
| 4,204,246 A | * | 5/1980 | Arii et al. | 361/699 |
| 6,517,218 B2 | * | 2/2003 | Hochstein | 362/294 |
| 6,517,221 B1 | * | 2/2003 | Xie | 362/373 |
| 6,910,794 B2 | * | 6/2005 | Rice | 362/547 |
| 2004/0141291 A1 | * | 7/2004 | Chen | 361/704 |
| 2004/0233671 A1 | * | 11/2004 | Staufert | 362/294 |
| 2004/0264195 A1 | * | 12/2004 | Chang et al. | 362/294 |
| 2005/0047140 A1 | * | 3/2005 | Chang | 362/267 |
| 2005/0047170 A1 | * | 3/2005 | Hilburger et al. | 362/547 |
| 2005/0063159 A1 | * | 3/2005 | Ma | 361/704 |
| 2005/0231983 A1 | * | 10/2005 | Dahm | 362/800 |
| 2006/0001384 A1 | * | 1/2006 | Tain et al. | 315/246 |
| 2006/0092639 A1 | * | 5/2006 | Livesay et al. | 362/294 |

FOREIGN PATENT DOCUMENTS

| | | |
|---|---|---|
| TW | 595016 | 6/2004 |
| TW | M246814 | 10/2004 |

\* cited by examiner

*Primary Examiner*—Alan Cariaso
*Assistant Examiner*—Leah S. Lovell
(74) *Attorney, Agent, or Firm*—Winston Hsu

(57) ABSTRACT

A light module comprises a light unit, a heat transferring plate or a plurality of heat transferring pipes, and a plurality of heat dissipating fins. The heat transferring plate or heat transferring pipes are positioned on the bottom surface of the light unit to transfer heat generated by the light unit. When the heat transferring plate is used, the heat dissipating fins are arranged under the heat transferring plate and perpendicular to the bottom surface of the heat transferring plate. The heat dissipating fins have a recess for the accommodation of the heat transferring plate and the light unit. When the heat transferring pipes are used, the heat dissipating fins each contact the heat transferring pipes. Uniform heat dissipation is thus attained.

7 Claims, 8 Drawing Sheets

LIGHT MODULE WITH COMBINED HEAT TRANSFERRING PLATE AND HEAT TRANSFERRING PIPES

BACKGROUND OF INVENTION

1. Field of the Invention

The present invention relates to a light module, and more particularly to a light module having good heat dissipation properties.

2. Description of the Prior Art

Fluorescent bulb, fluorescent tubes, or electric bulbs are used in traditional light devices as light source generators. In recent years, light-emitting diodes (LED) have been developed as light source generators. LED is a type of cold illumination and has the advantages of low power consumption, long device lifetime, no idling time, and quick response speed. In addition, since the LED also has the advantages of small size, suitability for mass production, and ease of fabrication as a tiny device or an array device, it has been widely applied in display apparatus and indicating lamps used in information, communication, consumer electronic products, and automotive industry, such as, cellular phones, as backlights of personal data assistants, outdoor traffic signal lamps or various outdoor displays, even as a components in the highly popular liquid crystal displays.

FIGS. 1 and 2 are each a cross section diagram illustratively showing a conventional LED module, respectively. As shown in FIG. 1, the conventional LED module includes a substrate 10, a plurality of LED units 12 positioned above the substrate 10, and an encapsulating material layer 14 disposed on the LED unit 12. As shown in FIG. 2, the conventional LED module includes a substrate 16, an insulating layer 18, a printed circuit board 20 positioned above the substrate 16, and a plurality of LED package bodies 22 disposed on the printed circuit board 20 and electrically connected to the printed circuit board 20. The LED package body 22 is constructed by forming the encapsulating material layer 24 via molding or sealant injection, and the entire LED module is then formed by aggregating each of the LED package bodies 22 on the substrate 16.

However, in conventional techniques for assembling light modules, such as the above mentioned LED modules, the substrate is generally a lead frame or a printed circuit board (PCB), and a plural LED chips are fixed onto the substrate, or a plurality of LED packages are combined, for forming a module or a light engine. The LED chips or package with the substrate only connect to heat dissipating fins for heat dissipation. Thus, uneven heat dissipation and local hot spots tend to occur. The resulting local high temperature will lead the LED to have disadvantages of a short lifetime, uneven color, or uneven light intensity.

Therefore, a novel light-emitting module having uniform heat dissipation for avoiding local hot spots is still needed.

SUMMARY OF INVENTION

An objective of the present invention is to provide a light module having advantages of uniform heat dissipation and no local hot spots.

In one embodiment according to the present invention, the light module comprises a light unit, a heat transferring plate, and a plurality of heat dissipating fins. The light unit provides a light source. The heat transferring plate is positioned on the bottom surface of the light unit to transfer heat generated by the light unit. The heat dissipating fins are arranged perpendicularly to the bottom surface direction of the light unit and have a recess for the accommodation of the heat transferring plate and the light unit, thereby the heat from the heat transferring plate is dissipated by the heat dissipating fins into an ambience. Thus, uniform heat dissipation is achieved.

In another embodiment according to the present invention, the light module comprises a light unit, a plurality of heat transferring pipes, and a plurality of heat dissipating fins. The light unit provides a light source. The heat transferring pipes connect the bottom surface of the light unit to transfer heat generated by the light unit. The heat dissipating fins each have a surface to contact the heat transferring pipes to dissipate the heat from the heat transferring pipes to an ambience.

In the light module according to the present invention, the heat transferring plate or the heat transferring pipes, the heat dissipating fins, and the light unit are combined to construct a light module, such as a high power LED module or light engine, having excellent heat dissipation without occurrence of uneven heat dissipation and hot spots, which would occur in conventional light modules. Therefore, the reliability and lifetime of the light module are improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
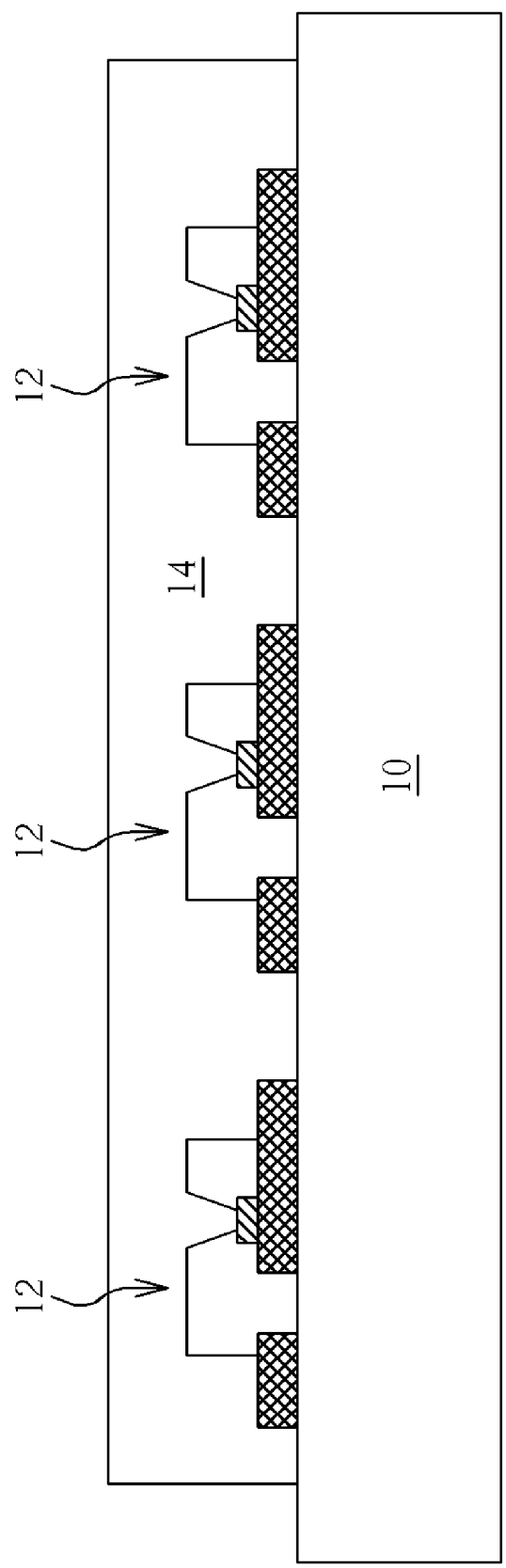
FIG. 1 is a schematic cross-sectional diagram showing a conventional LED module.
Figure 2:
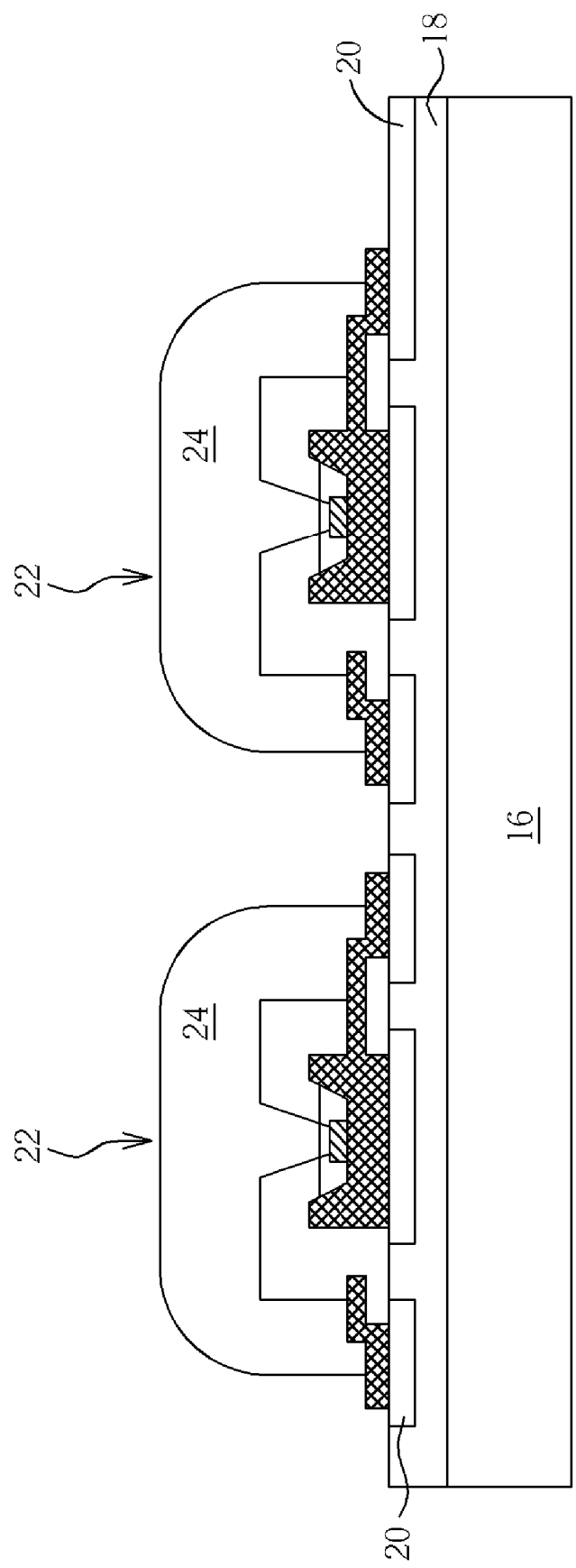
FIG. 2 is a schematic cross-sectional diagram showing a conventional LED module containing a plurality of package bodies each having a singular LED.
Figure 3:
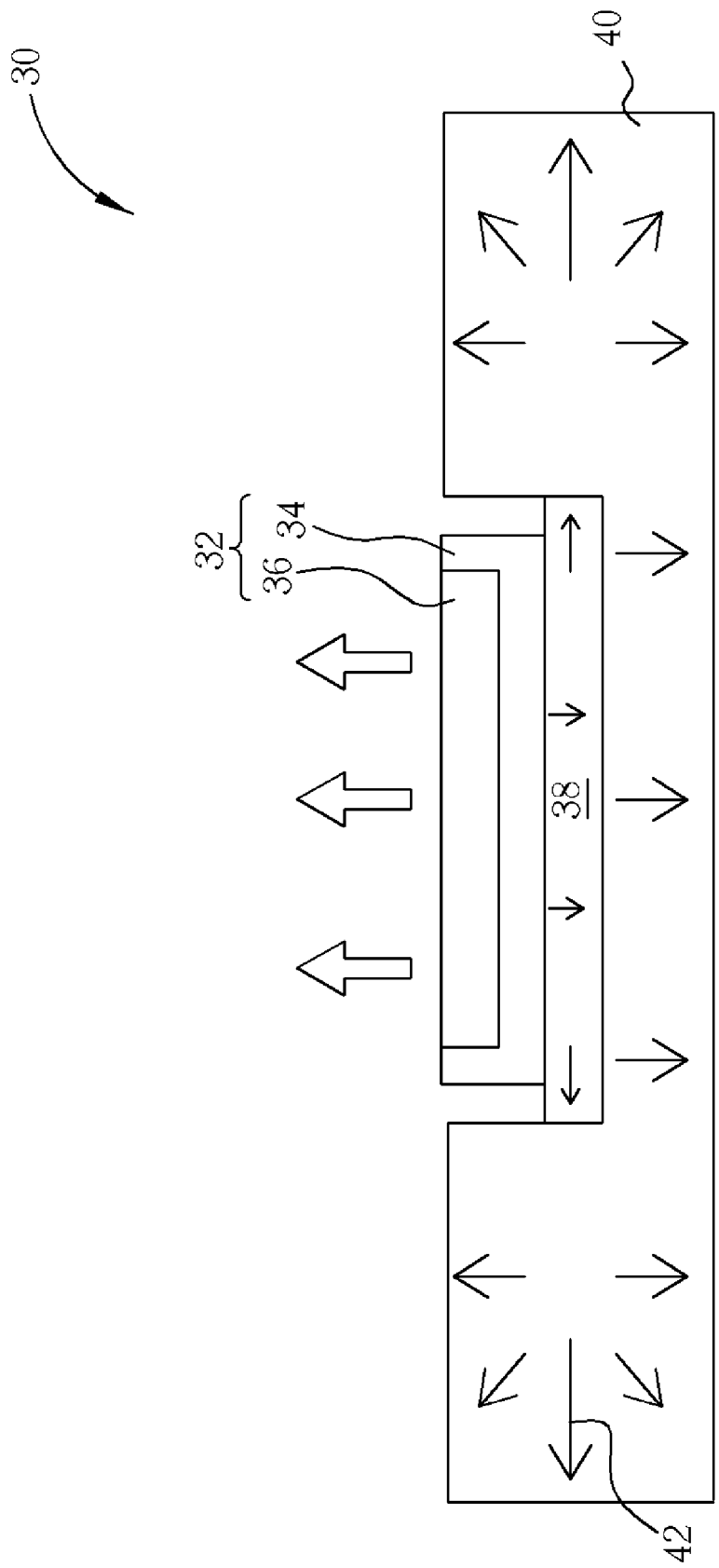
FIG. 3 is a schematic cross-sectional diagram showing an LED module according to an embodiment of the present invention.

Please refer to FIG. 3. FIG. 3 is a schematic cross-sectional diagram showing an LED module according to an embodiment of the present invention. As shown in FIG. 3, the light module 30 according to the present invention comprises a light unit 32, a heat transferring plate 38, and a plurality of heat dissipating fins 40.

The light unit 32 provides a light source and typically comprises a substrate 34 and a light-emitting element 36. The substrate 34 is preferably in a flat shape for correspondingly matching up the shape of the heat transferring plate 38.

The light-emitting element 36 may be a traditional electric bulb light source, or a packaged LED element, module, or light engine, such as the conventional LED as mentioned above, not limited to lead type or chip type LEDs. The light-emitting element 36 also may be a package body comprising one LED or an aggregate of a plurality of LEDs. The light-emitting element 36 also may be an aggregate comprising a plurality of LEDs package bodies. A commercial LED product can be used in the present invention. Since a high brightness is desired, the light-emitting element 36 probably produces an amount of heat. The substrate 34 preferably comprises a good heat conducting material for heat transfer. The conduction direction for heat may be as shown by the heat flow 42 in FIG. 3.

Figure 8:
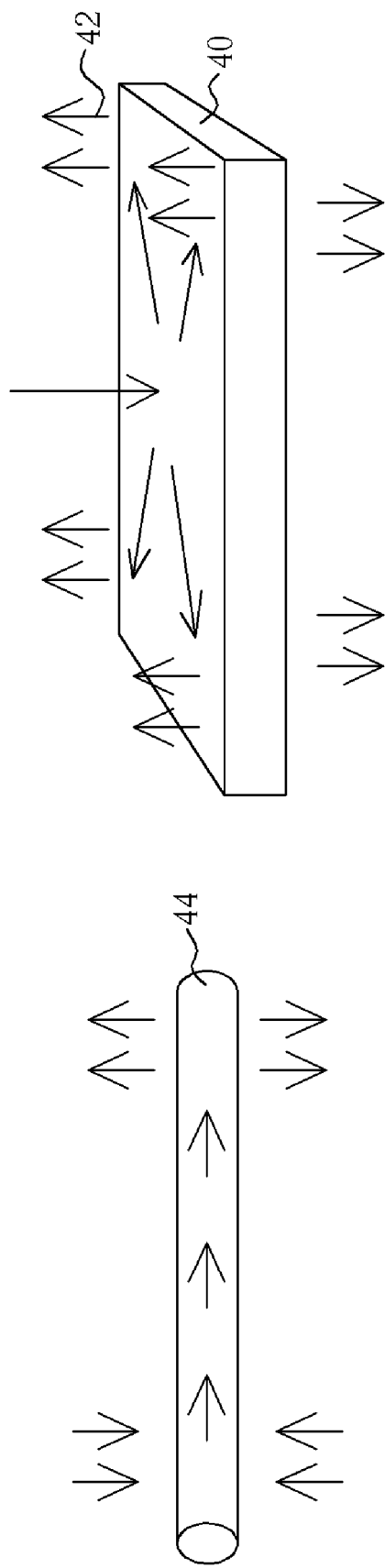
FIG. 8 is a schematic diagram showing heat transferring paths and a structure for a heat transferring pipe and a heat transferring plate.
Figure 8:
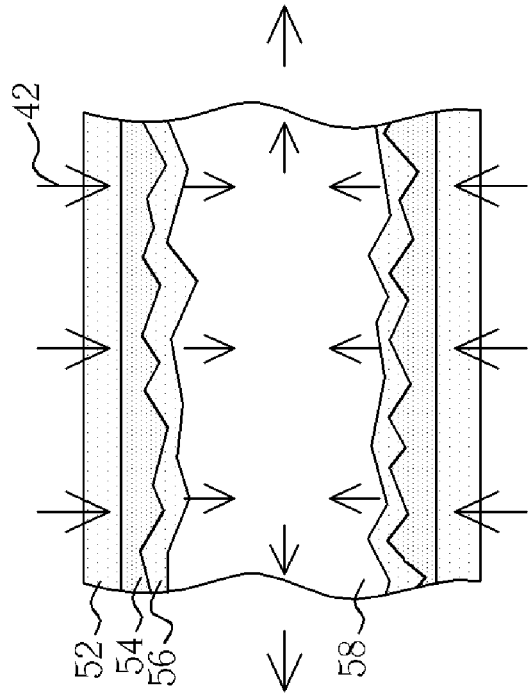

The heat transferring plate 38 is positioned on the bottom surface of the light unit 32 by means of, for example, adhesion to the substrate 34 with a conductive silver adhesive or a solder, such that the heat transferring plate 38 is in contact with the substrate 34 to transfer heat generated by the light unit 32. The heat transferring plate 38 is a hollow structure with a double-layered wall, as shown in FIG. 8. The outer wall 52 comprises a heat conducting material, such as metal. The inner wall 54 comprises a porous heat conducting material, which may be formed by, for example, depositing cupper powder on the internal surface of the outer wall 52. The porous heat conducting material can adsorb liquid. Since both the outer wall and the inner wall each comprise a heat conducting material, they can transfer heat. The heat transferring plate 38 further comprises a liquid 56 adsorbed by the porous inner wall 54. The liquid 56 comprises a heat medium material. After the heat medium material absorbs heat from the porous inner wall 54, it may evaporate to become a gas and diffuse in a space 58 inside the heat transferring plate 38, thereby to transfer the heat to a relative cold place. The gas may condense at the relative cold place on the inner wall to recover the state of liquid, and the liquid will evaporate and become the gas again when receiving a heat.

Figure 4:
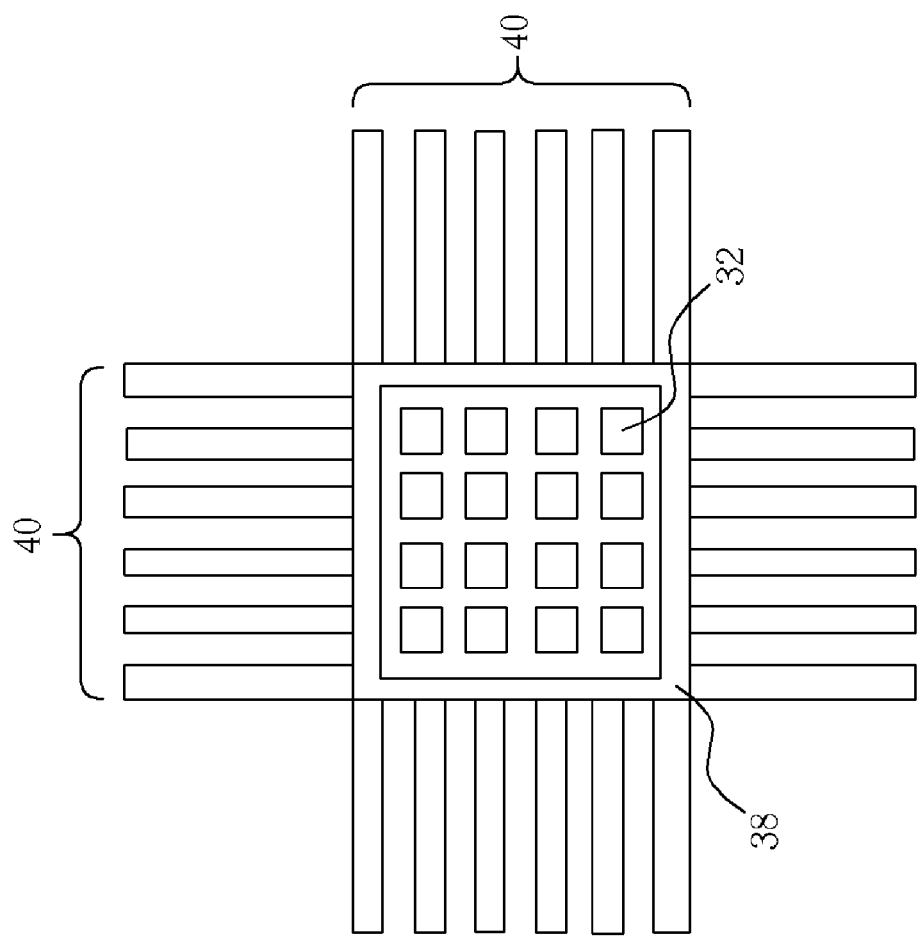
FIG. 4 is a schematic top view diagram showing an LED module according to an embodiment of the present invention.

The heat transferring plate 38 and the light unit 32 are accommodated among a plurality of heat dissipating fins 40. The heat dissipating fin comprises a heat conducting sheet material, such as a metal sheet, typically an aluminum sheet or a copper sheet, having a large area for advantageously dissipating heat. In the present invention, the heat dissipating fins 40 are arranged upright and perpendicularly to the bottom surface direction of the light unit 32 and have a recess with a size and a shape corresponding to the heat transferring plate 38 and the light unit 32 for accommodating them and adhering to each other. In the top view diagram shown in FIG. 4, the heat dissipating fins 40 may be arranged to intersect and exhibit a grid shape by a top view. The recess is designed to accommodate the light unit 32 and the heat transferring plate 38. The shape of the recess is not particularly limited as long as it can match up the product design and use. Such that, the heat from the heat transferring plate 38 can be dissipated into an ambience, such as the air, by the heat dissipating fins 40.

The interfaces between two of the light unit 32, the heat transferring plate 38, and the heat dissipating fins 40 are each filled with a heat dissipating paste or gel, for increasing the contact area for heat conduction, such that the heat dissipation is more efficient.

Figure 5:
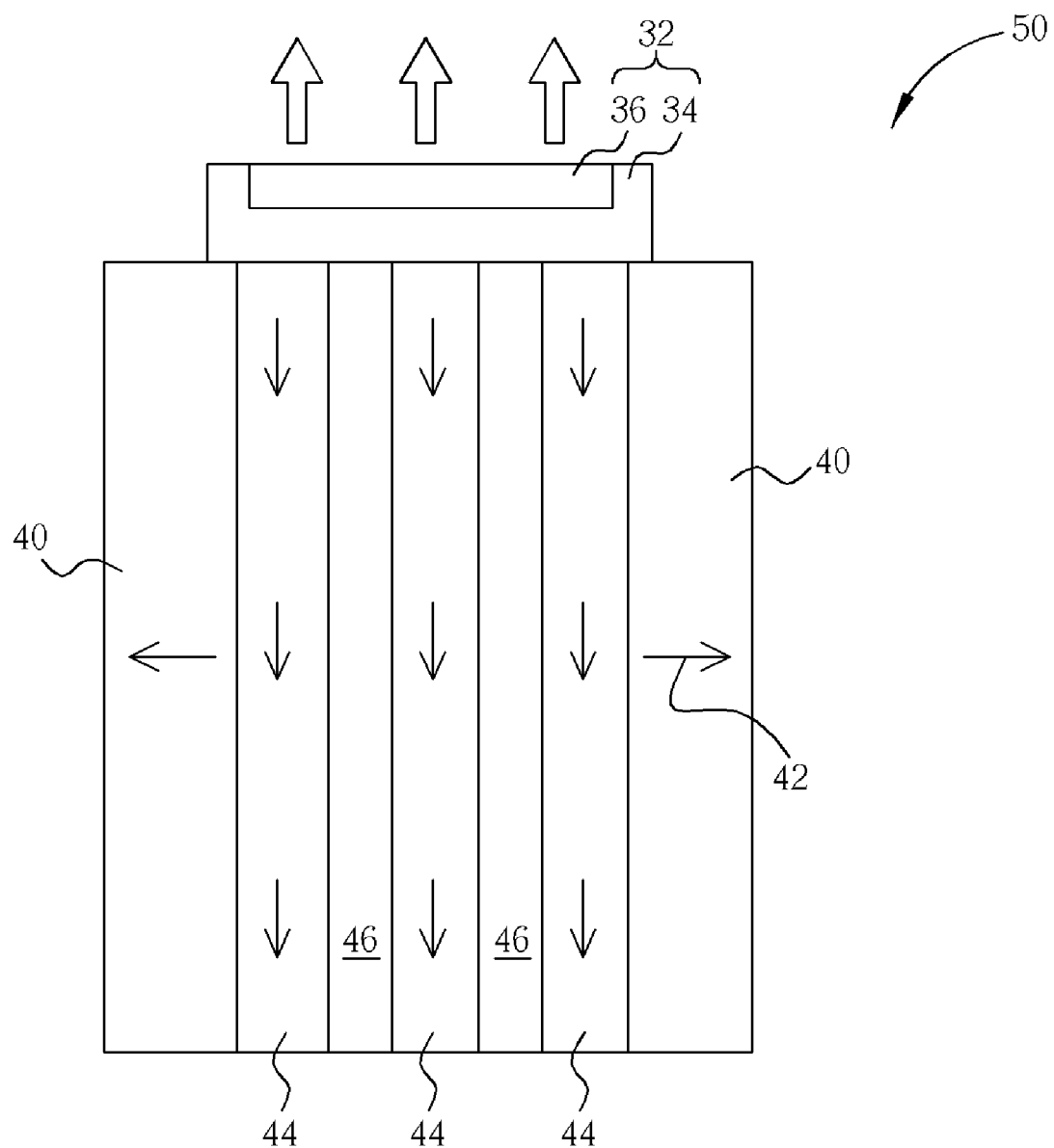
FIG. 5 is a schematic cross-sectional diagram showing an LED module according to another embodiment of the present invention.

When the light module designed to be in a flat shape, a heat transferring plate is preferably used in the present invention. When the light module designed to be in a long shape, a plurality of heat transferring pipes are used instead of the heat transferring plate in the present invention to match up the shape. As shown in FIG. 5, the light module 50 in another embodiment according to the present invention comprises a light unit 32, a plurality of heat transferring pipes, and a plurality of heat dissipating fins 40.

The light unit 32 provides a light source, as mentioned in the above. The heat transferring pipes 44 are positioned on the bottom surface of the substrate 34 of the light unit 32, such that the heat transferring plate 38 is in contact with the substrate 34 to transfer heat generated by the light-emitting element 36. The heat transferring pipes 44 are each a closed hollow column structure with a double-layered wall, as shown in FIG. 8. The outer wall and the inner wall have a structure similar to the above-mentioned heat transferring plate 38. The heat transferring pipe comprises a liquid 56 as a heat medium. After the heat medium absorbs heat from the porous inner wall 54, it may evaporate to become a gas and diffuse in a space 58 inside the heat transferring pipe 44, thereby to transfer the heat to a relative cold place. The gas may condense at the relative cold place (such as the place far from the light unit) on the inner wall to recover the state of liquid, and the liquid will evaporate and become the gas again when receiving a heat.

Figure 6:
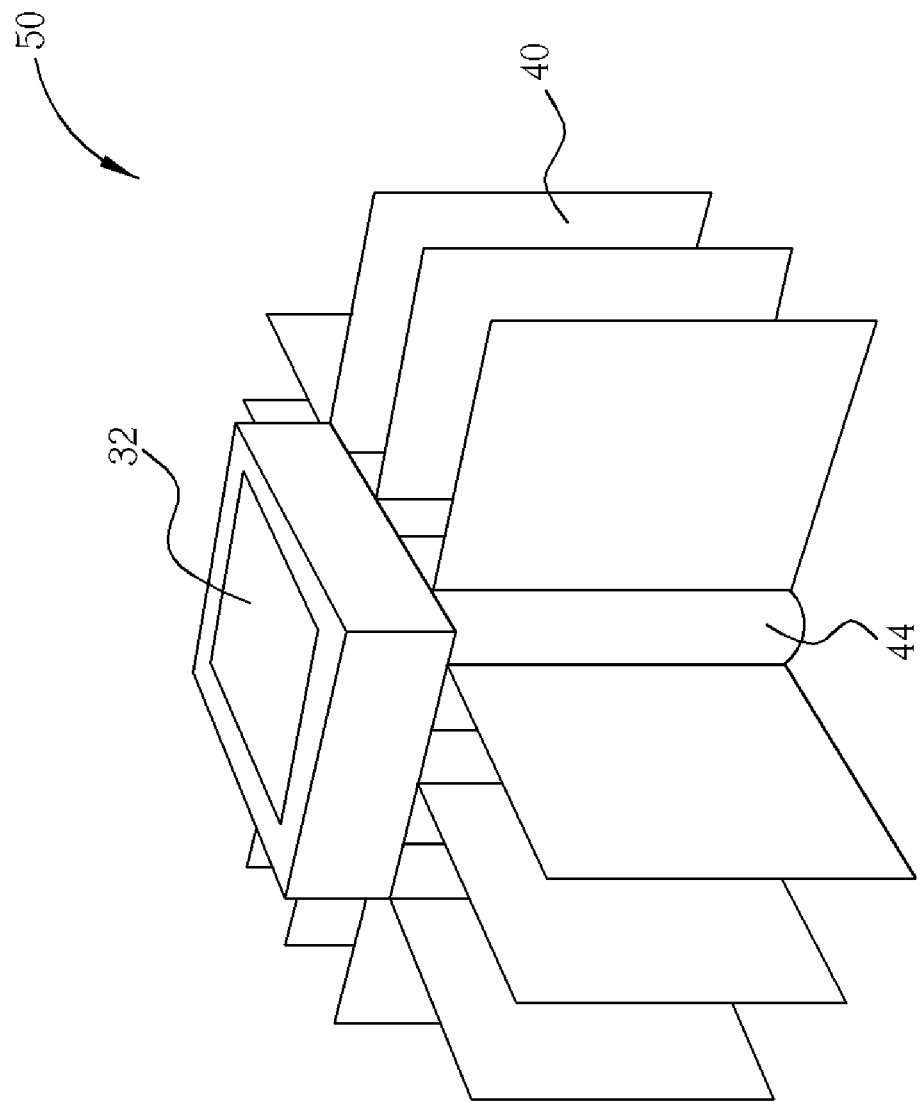
FIG. 6 is a schematic side view diagram showing an LED module according to another embodiment of the present invention.
Figure 7:
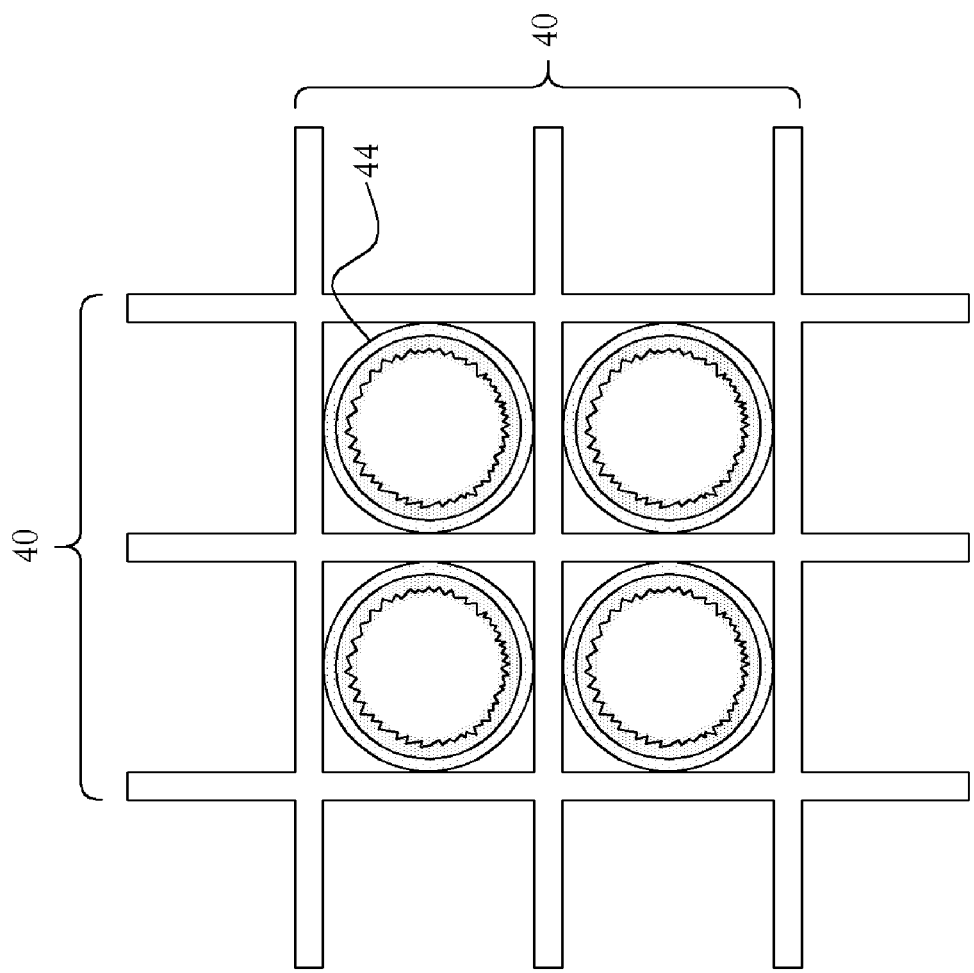
FIG. 7 is a schematic cross-sectional diagram showing an LED module according to still another embodiment of the present invention.

The heat dissipating fins each contact with the heat transferring pipes to transfer heat from the heat transferring pipes into ambience. As shown in the schematic side view diagram in FIG. 6, the heat dissipating fins 40 may only connect to the peripheral ones of the heat transferring pipes 44 with a silver adhesive or a solder and extend outward. Gaps 46 formed among the heat transferring pipes may be further filled with a heat dissipating paste or gel for heat dissipation. Or, as shown in the schematic cross-sectional diagram in FIG. 7, the heat dissipating fins 40 may intersect to form a plurality of holes having polygonal patterns in plan view among the intersected heat dissipating fins. The heat transferring pipes 44 are disposed through the holes and contact with the heat dissipating fins 40 for heat transfer and dissipation. Gaps formed between the heat dissipating fins 40 and the heat transferring pipes 44 may be filled with a heat dissipating paste or gel.

According to the present invention described as the above, the heat transferring plate or pipes, the heat dissipating fins, and the light unit are combined to construct a light module. Since there is a liquid as a heat medium inside the heat transferring plate or pipes, after heat transferred to the porous inner wall, the liquid adsorbed on the inner wall will absorb the heat and evaporate as a gas and promptly diffuse in the space inside the plate or pipes. Then, the gas condenses at places having relatively low temperatures on the inner wall, and the heat is simultaneously dissipated from the inner wall to the outer wall, then into the ambience. Therefore, a fast heat dissipation effect is achieved. The heat transferring plate or pipes are selected to match up the desired design for the entire light module. The heat transferring plate is suitably used in a flat light source device. The heat transferring pipes are suitably used in a light module having an elongated size and a high intensity light source.

Compared with the conventional light devices, the light module according to the present invention may have a structure of small sized but relatively high heat dissipation design, and, accordingly, high power light modules or engines with LEDs can be attained and have advantages of fast and uniform heat dissipation without hot spots. Thus, the LED light modules have improved reliability and lifetime. The light module according to the present invention is adaptable to various applications. Various designs for the heat transferring plate or the heat transferring pipes can be selected for various light module products in various applications, such as, general illuminations, LCD back light modules, vehicle illuminations, and decoration illuminations, etc.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light module, comprising:
    a light unit for providing a light source;
    a heat transferring plate positioned on the bottom surface of the light unit to transfer heat generated by the light unit;
    a plurality of heat dissipating fins arranged perpendicularly to the bottom surface direction of the light unit and having a recess for the accommodation of the heat transferring plate and the light unit, for dissipating the heat; and
    a plurality of heat transferring pipes disposed among the heat dissipating fins under the heat transferring plate, wherein the heat dissipating fins each have an outer surface to contact the outer surface of the heat transferring pipes, and the heat dissipating fins and the heat transferring pipes are not intersected with each other.

2. The light module of claim 1, wherein, the heat dissipating fins intersect to form a plurality of holes having polygonal patterns in plan view among the intersected heat dissipating fins, and the heat transferring pipes are disposed through the holes.

3. The light module of claim 1, wherein an interface between two of the light unit, the heat transferring plate, the heat dissipating fins, and the heat transferring pipes is filled with a heat dissipating paste or gel.

4. The light module of claim 1, wherein the heat transferring plate has a hollow structure comprising:
    an outer wall comprising a heat conducting material for transferring heat;
    a porous inner wall positioned on the internal surface of the outer wall and comprising a heat conducting material for transferring heat; and
    a liquid comprising a heat medium material and adsorbed by the porous inner wall, wherein the liquid absorbs heat from the porous inner wall and evaporates to become a gas diffusing in a space inside the heat transferring plate.

5. The light module of claim 1, wherein the heat transferring pipes have a closed hollow structure comprising:
    an outer wall comprising a heat conducting material for transferring heat;
    a porous inner wall positioned on the internal surface of the outer wall and comprising a heat conducting material for transferring heat; and
    a liquid comprising a heat medium material and adsorbed by the porous inner wall, wherein the liquid absorbs heat from the porous inner wall and evaporates to become a gas diffusing in a space inside the heat transferring pipes.

6. The light module of claim 1, wherein the light unit comprises:
    a substrate; and
    at least one light-emitting diode encapsulated on the substrate with an encapsulating material.

7. The light module of claim 1, wherein the substrate comprises a heat conducting material.

* * * * *